(12) United States Patent
Kraus et al.

(10) Patent No.: US 6,304,989 B1
(45) Date of Patent: Oct. 16, 2001

(54) BUILT-IN SPARE ROW AND COLUMN REPLACEMENT ANALYSIS SYSTEM FOR EMBEDDED MEMORIES

(75) Inventors: Lawrence Kraus, San Jose; Ivan-Pierre Batinic, San Martin, both of CA (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/358,689

(22) Filed: Jul. 21, 1999

(51) Int. Cl.[7] .................................................. G01R 31/28
(52) U.S. Cl. ............................................. 714/733; 714/718
(58) Field of Search ............................. 395/401; 714/710, 714/711, 7, 733, 718; 365/200, 201

(56) References Cited

U.S. PATENT DOCUMENTS

| | | | |
|---|---|---|---|
| 5,577,050 | 11/1996 | Bair et al. ............................. | 714/710 |
| 5,602,999 | * 2/1997 | Hyatt .................................... | 395/401 |
| 5,758,056 | * 5/1998 | Barr ...................................... | 714/710 |
| 5,764,878 | 6/1998 | Kablanian et al. ...................... | 714/7 |
| 5,920,515 | * 7/1999 | Shaik et al. .......................... | 365/200 |
| 5,987,632 | * 11/1999 | Irrinki et al. ......................... | 714/711 |
| 6,065,134 | * 5/2000 | Bair et al. ............................. | 714/7 |
| 6,067,262 | * 5/2000 | Irrinki et al. ......................... | 365/201 |
| 6,141,779 | * 10/2000 | Hill et al. ............................. | 714/710 |

* cited by examiner

Primary Examiner—David Ton
(74) Attorney, Agent, or Firm—Daniel J. Bedell; Smith-Hill and Bedell

(57) ABSTRACT

A built-in replacement analysis (BIRA) circuit allocates spare rows and columns of cells for replacing rows and columns of an array of memory cells in response to an input sequence of cell addresses, each identifying a row address and a column address of each defective cell of the cell array. The BIRA subsystem, including a row register corresponding each spare row and a column register corresponding to each spare column, responds to incoming cell addresses by writing their included row address into the row registers, by writing their column addresses into the column registers, and by writing link bits into the column registers. Each link bit links a row and a column register by storing row and column addresses of a defective cell. The BIRA subsystem also writes a "multiple cell" bit into each row register to indicate when the row address it stores includes more than one defective cell. The row and column addresses stored in these registers indicate the array rows and columns for which spare rows and columns are to be allocated. Each row and column register also includes a "permanent" bit the BIRA subsystem sets to indicate when the spare row or column allocation indicated by its stored row or column address is permanent. The BIRA subsystem efficiently allocates spare row and columns by manipulating the data stored in the row and column registers in response to a sequence of defective cell address.

18 Claims, 11 Drawing Sheets

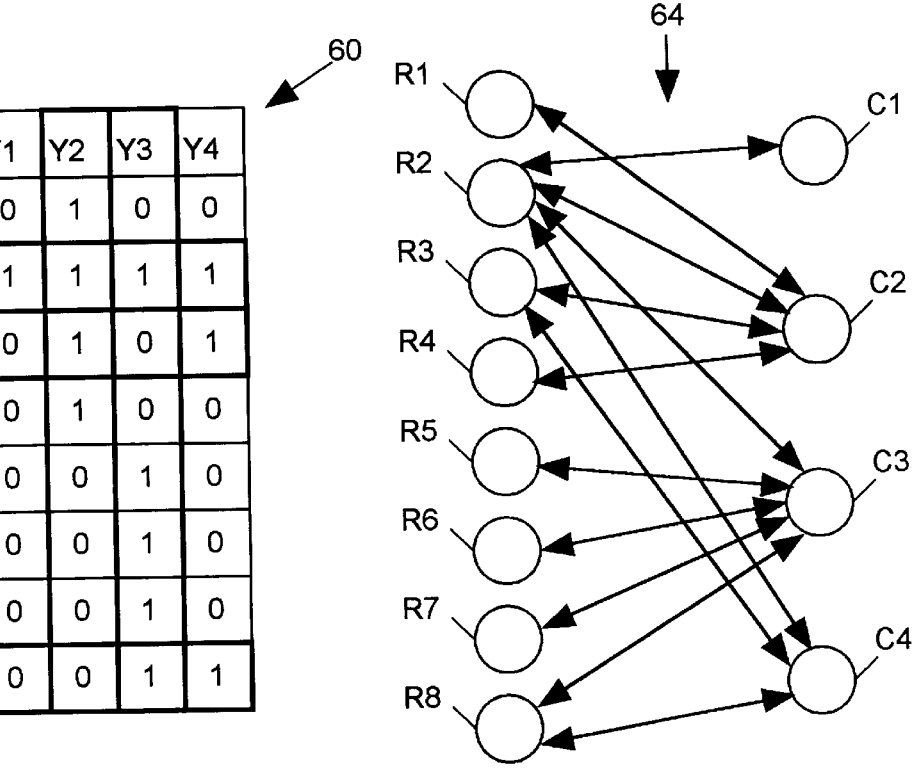
FIG. 2
FIG. 3
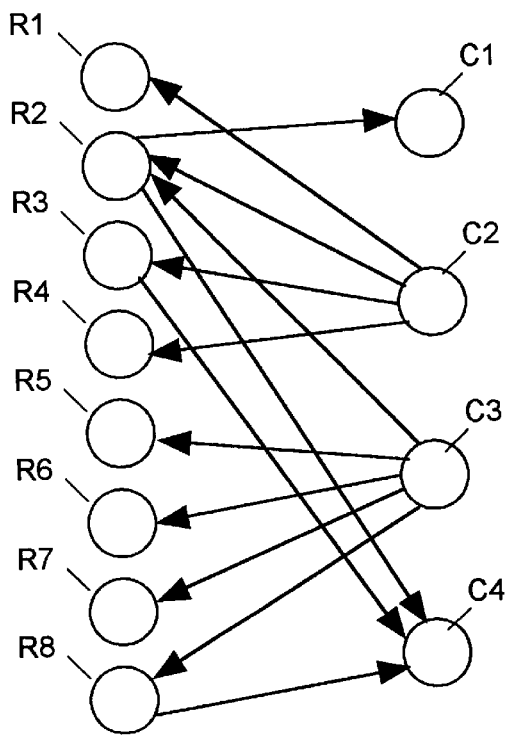
FIG. 4
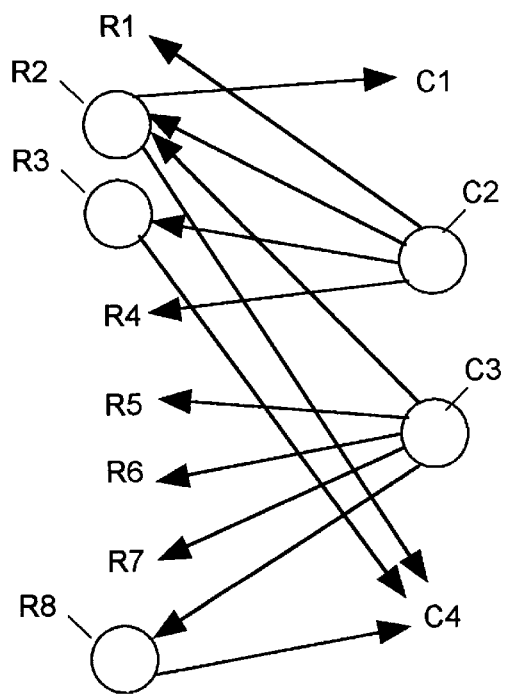
FIG. 5

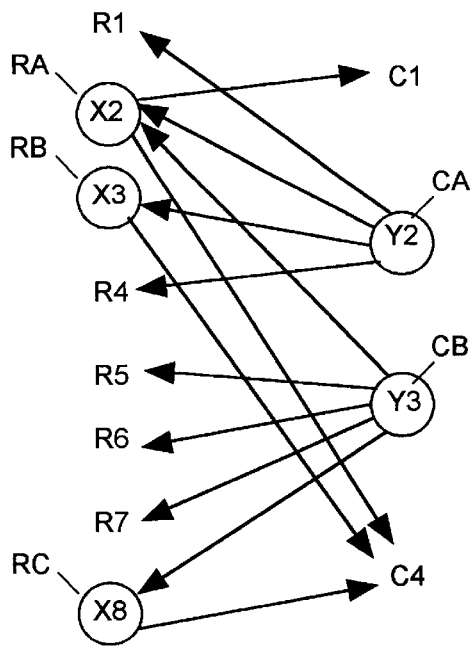
FIG. 6
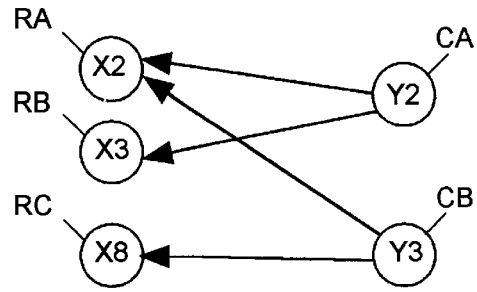
FIG. 7
| X REGISTER FILE | | | |
|---|---|---|---|
|  | XADDR | XP | XM |
| RA | X2 | 1 | 1 |
| RB | X3 | 1 | 1 |
| RC | X8 | 0 | 1 |
FIG. 8
| Y REGISTER FILE | | | | | |
|---|---|---|---|---|---|
|  | YADDR | YP | LA | LB | LC |
| CA | Y2 | 1 | 1 | 1 | 0 |
| CB | Y3 | 1 | 1 | 0 | 1 |
FIG. 9

| X REGISTER FILE | | | |
|---|---|---|---|
| | XADDR | XP | XM |
| RA | NULL | 0 | 0 |
| RB | NULL | 0 | 0 |
| RC | NULL | 0 | 0 |

FIG. 10

| Y REGISTER FILE | | | | | |
|---|---|---|---|---|---|
| | YADDR | YP | LA | LB | LC |
| CA | NULL | 0 | 0 | 0 | 0 |
| CB | NULL | 0 | 0 | 0 | 0 |

FIG. 11

| X REGISTER FILE | | | |
|---|---|---|---|
| | XADDR | XP | XM |
| RA | X1 | 0 | 0 |
| RB | NULL | 0 | 0 |
| RC | NULL | 0 | 0 |

FIG. 12

| Y REGISTER FILE | | | | | |
|---|---|---|---|---|---|
| | YADDR | YP | LA | LB | LC |
| CA | Y2 | 0 | 1 | 0 | 0 |
| CB | NULL | 0 | 0 | 0 | 0 |

FIG. 13

| X REGISTER FILE | | | |
|---|---|---|---|
| | XADDR | XP | XM |
| RA | X1 | 0 | 0 |
| RB | X2 | 0 | 0 |
| RC | NULL | 0 | 0 |

FIG. 14

| Y REGISTER FILE | | | | | |
|---|---|---|---|---|---|
| | YADDR | YP | LA | LB | LC |
| CA | Y2 | 0 | 1 | 0 | 0 |
| CB | Y1 | 0 | 0 | 1 | 0 |

FIG. 15

| X REGISTER FILE | | | |
|---|---|---|---|
| | XADDR | XP | XM |
| RA | X1 | 0 | 0 |
| RB | X2 | 0 | 1 |
| RC | NULL | 0 | 0 |

FIG. 16

| Y REGISTER FILE | | | | | |
|---|---|---|---|---|---|
| | YADDR | YP | LA | LB | LC |
| CA | Y2 | 0 | 1 | 1 | 0 |
| CB | Y1 | 0 | 0 | 1 | 0 |

FIG. 17

| X REGISTER FILE | | | |
|---|---|---|---|
| | XADDR | XP | XM |
| RA | X1 | 0 | 0 |
| RB | X2 | 1 | 1 |
| RC | NULL | 0 | 0 |

FIG. 18

| Y REGISTER FILE | | | | | |
|---|---|---|---|---|---|
| | YADDR | YP | LA | LB | LC |
| CA | Y2 | 0 | 1 | 1 | 0 |
| CB | NULL | 0 | 0 | 0 | 0 |

FIG. 19

| X REGISTER FILE | | | |
|---|---|---|---|
| | XADDR | XP | XM |
| RA | X1 | 0 | 0 |
| RB | X2 | 1 | 1 |
| RC | X3 | 0 | 0 |

FIG. 20

| Y REGISTER FILE | | | | | |
|---|---|---|---|---|---|
| | YADDR | YP | LA | LB | LC |
| CA | Y2 | 0 | 1 | 1 | 1 |
| CB | NULL | 0 | 0 | 0 | 0 |

FIG. 21

| X REGISTER FILE | | | |
|---|---|---|---|
| | XADDR | XP | XM |
| RA | X1 | 0 | 0 |
| RB | X2 | 1 | 1 |
| RC | X3 | 0 | 1 |

FIG. 22

| Y REGISTER FILE | | | | | |
|---|---|---|---|---|---|
| | YADDR | YP | LA | LB | LC |
| CA | Y2 | 0 | 1 | 1 | 1 |
| CB | Y4 | 0 | 0 | 0 | 1 |

FIG. 23

| X REGISTER FILE | | | |
|---|---|---|---|
| | XADDR | XP | XM |
| RA | NULL | 0 | 0 |
| RB | X2 | 1 | 1 |
| RC | X3 | 1 | 1 |

FIG. 24

| Y REGISTER FILE | | | | | |
|---|---|---|---|---|---|
| | YADDR | YP | LA | LB | LC |
| CA | Y2 | 1 | 0 | 0 | 0 |
| CB | NULL | 0 | 0 | 0 | 0 |

FIG. 25

| X REGISTER FILE | | | |
|---|---|---|---|
| | XADDR | XP | XM |
| RA | X5 | 0 | 0 |
| RB | X2 | 1 | 1 |
| RC | X3 | 1 | 1 |

FIG. 26

| Y REGISTER FILE | | | | | |
|---|---|---|---|---|---|
| | YADDR | YP | LA | LB | LC |
| CA | Y2 | 1 | 0 | 0 | 0 |
| CB | Y3 | 0 | 1 | 0 | 0 |

FIG. 27

| X REGISTER FILE | | | |
|---|---|---|---|
| | XADDR | XP | XM |
| RA | NULL | 0 | 0 |
| RB | X2 | 1 | 1 |
| RC | X3 | 1 | 1 |

FIG. 28

| Y REGISTER FILE | | | | | |
|---|---|---|---|---|---|
| | YADDR | YP | LA | LB | LC |
| CA | Y2 | 1 | 0 | 0 | 0 |
| CB | Y3 | 1 | 0 | 0 | 0 |

FIG. 29

| X REGISTER FILE | | | |
|---|---|---|---|
| | XADDR | XP | XM |
| RA | X8 | 1 | 0 |
| RB | X2 | 1 | 1 |
| RC | X3 | 1 | 1 |

FIG. 30

| Y REGISTER FILE | | | | | |
|---|---|---|---|---|---|
| | YADDR | YP | LA | LB | LC |
| CA | Y2 | 1 | 0 | 0 | 0 |
| CB | Y3 | 1 | 0 | 0 | 0 |

FIG. 31

|    | Y1 | Y2 | Y3 | Y4 | Y5 |
|----|----|----|----|----|----|
| X1 | 1  | 0  | 0  | 0  | 0  |
| X2 | 0  | 1  | 0  | 0  | 0  |
| X3 | 0  | 0  | 1  | 0  | 0  |
| X4 | 0  | 0  | 0  | 1  | 0  |
| X5 | 0  | 0  | 0  | 0  | 1  |

FIG. 32

| X REGISTER FILE | | | |
|----|-------|----|----|
|    | XADDR | XP | XM |
| RA | X1    | 0  | 0  |
| RB | X2    | 0  | 0  |
| RC | X3    | 1  | 0  |

FIG. 33

| Y REGISTER FILE | | | | | |
|----|-------|----|----|----|----|
|    | YADDR | YP | LA | LB | LC |
| CA | Y1    | 0  | 1  | 0  | 1  |
| CB | Y2    | 0  | 0  | 1  | 0  |

FIG. 34

| X REGISTER FILE | | | |
|----|-------|----|----|
|    | XADDR | XP | XM |
| RA | X1    | 1  | 0  |
| RB | X2    | 1  | 0  |
| RC | X3    | 1  | 0  |

FIG. 35

| Y REGISTER FILE | | | | | |
|----|-------|----|----|----|----|
|    | YADDR | YP | LA | LB | LC |
| CA | Y4    | 1  | 0  | 0  | 0  |
| CB | Y5    | 1  | 0  | 0  | 0  |

FIG. 36

| XF | YF | CX | CY | XPC | YPC | ACTION |
|----|----|----|----|-----|-----|--------|
| X | X | X | X | X | 1 | NO ACTION |
| X | X | X | X | 1 | X | NO ACTION |
| 0 | 0 | 0 | 0 | 0 | 0 | LATCHX;LATCHY;LATCHC |
| 0 | 0 | 0 | 1 | 0 | 0 | LATCHX;ADDC |
| 0 | 0 | 1 | 0 | 0 | 0 | LATCHY;LATCHC |
| 0 | 0 | 1 | 1 | 0 | 0 | ADDC |
| 0 | 1 | 0 | 0 | 0 | 0 | LATCHXP |
| 0 | 1 | 0 | 1 | 0 | 0 | LATCHX;ADDC |
| 0 | 1 | 1 | 0 | 0 | 0 | MAKEXP;SUBC;REMY0D |
| 0 | 1 | 1 | 1 | 0 | 0 | ADDC |
| 1 | 0 | 0 | 0 | 0 | 0 | LATCHYP |
| 1 | 0 | 0 | 1 | 0 | 0 | MAKEYP;REMX1D;MAKEXMD |
| 1 | 0 | 1 | 0 | 0 | 0 | LATCHY;LATCHC |
| 1 | 0 | 1 | 1 | 0 | 0 | ADDC |
| 1 | 1 | 0 | 0 | 0 | 0 | REPNPYLD;MAKEXPIPFC |
| 1 | 1 | 0 | 1 | 0 | 0 | MAKEYP;REMX1;MAKEXMD |
| 1 | 1 | 1 | 0 | 0 | 0 | MAKEXP;SUBC;REMY0D |
| 1 | 1 | 1 | 1 | 0 | 0 | ADDC |

FIG. 40

BUILT-IN SPARE ROW AND COLUMN REPLACEMENT ANALYSIS SYSTEM FOR EMBEDDED MEMORIES

BACKGROUND OF THE INVENTION

1. Field of the Invention

The present invention relates in general to built-in self-repair (BISR) systems for integrated circuits employing embedded memories, and in particular to a BISR system employing an efficient spare row and column replacement analysis system.

2. Description of Related Art

Integrated circuit (IC) designers often incorporate one or more random access memories (RAMs) into application specific integrated circuits (ASICs) to avoid manufacturing and performance costs associated with interconnecting the ASICs to separate RAMs at the circuit board level. However a RAM embedded in an ASIC may include thousands or millions of memory cells, and if any one of those cells is defective when manufactured, the ASIC is unusable. Radiation can also damage RAM cells when an ASIC is in use.

One approach to decreasing the percentage of ASICS that are unusable due to defective memory cells has been to replace defective memory cells with spare cells that have been incorporated into the ASIC. The memory cells of a RAM are arrayed into rows and columns, and a memory address identifies a particular cell to be read or write accessed by identifying its row and column position within the cell array. An address decoder decodes a read or write address to send a row enable signal to all cells of the identified row and a column enable signal to all cells of the identified column. The particular memory cell receiving both the row and column enable signals is enabled to read or write data appearing on data lines linked to all cells of the array. ASICs usually provide spare cells in the form of one or more spare columns of memory cells. When a memory cell in any particular column is found to be defective, the memory is reconfigured to replace all cells of that column with a spare column.

There are various ways to reconfigure a memory to implement spare column replacement. Some systems reroute the defective column's column enable line to the spare column, for example by using a laser to alter routing paths within the ASIC. Other systems implement the column replacement by changing the way the address decoder decodes the address so that it sends a column enable signal to the spare column instead of the defective column whenever the defective column is addressed. This usually involves writing data into a register the address decoder consults when decoding addresses.

Spare column replacement systems are not very efficient in their use of spare memory cells because they replace an entire column of memory cells even when only one cell in the column is defective. In order to be able to replace at least N defective memory cells, an ASIC would have to incorporate at least N entire spare columns of cells. To improve cell replacement efficiency, some systems provide spare memory rows in addition to spare memory columns so that when a memory cell is found to be defective it can be replaced by replacing either its row or its column with a spare row or column. For example when a defective cell is the only defective cell of its row, but is one of two or more defective cells of its column, then it is more efficient to replace its column with a spare column than to replace its row with a spare row. Conversely, when a defective cell is the only defective cell of its column but is one of two or more defective cells of its row, it is preferable to replace its row.

When an ASIC memory includes only spare columns, then each column can be tested in turn and immediately replaced with a spare column when it is found to have a defective cell. On the other hand when an ASIC memory includes spare columns and spare rows, then we would like to test memory cells of all rows and columns before deciding how to best allocate the spare rows and columns. To do so a test and repair system must store data indicating the address of each cell found to be defective until the end of the test, and then analyze that data to determine how to best allocate the spare rows and columns. For example a test and repair system may store that data in the form of a bit map, wherein each bit indicates whether a corresponding memory cell is defective. Since such a bit map requires as many cells as the memory itself, it isn't practical to provide a circuit for storing and analyzing such a bit map on the ASIC itself. Therefore the portions of test and repair systems that store and analyze such bit map data are typically located outside the ASIC. The test results data for each memory cell is therefore transmitted off chip as it is generated so that there are no on-chip test result data storage requirements.

For many reasons it is desirable to provide an ASIC with a "built-in self-repair" (BISR) system that can test and repair a memory with little or no communication with devices external to the ASIC. For example radiation or other environmental factors can cause a memory cell in an ASIC to fail long after it has passed a test at the factory. When the ASIC includes a BISR system enabled, for example, on ASIC power up or in response to an externally generated enabling signal, the BISR system can automatically test for and replace damaged cells. Since the BISR system is wholly contained within the ASIC, it isn't necessary to remove the ASIC from its normal operating environment or to connect it to external test and repair equipment.

Self-contained BISR systems have not been able to take full advantage of the efficiencies provided by combined spare column and spare row replacement because it has not been practical for them to store test results for all cells so that they can be analyzed at the end of the test to determine the best way to allocate spare rows and columns. U.S. Pat. No. 5,764,878 issued Jun. 9, 1998 to Kablanian et al describes a BISR system that organizes memory columns into blocks of several columns each and tests and repairs each block in turn. If a block of columns has one or more defective cells, a built-in repair analysis (BIRA) subsystem of the BISR system decides whether to repair the block by replacing memory rows with spare rows or by replacing the entire block with a spare block. Since the BISR system only tests and repairs one memory block at a time, it doesn't have to store and analyze test results data for the entire memory array at once. However since the BIRA subsystem makes its row and column replacement selections without having fully mapped the defective cells of the memory, the BISR System will not always optimize its allocation of spare rows and column blocks. Since the described BIRA system tests first on a row-by-row basis and then on a column-by-column basis, the system may impact test flexibility insofar as blocks must be tested individually and will have an effect on test time.

U.S. Pat. No. 5,577,050 also describes a BISR system employing both spare row and spare column replacement. The BISR system first checks each column in turn to determine whether the column has a "global" fault (such as column line stuck or open faults) that can affect more than one cell of a column. However it does not individually test each cell of a column. When it finds such a global error in a column, the BISR system replaces the defective column with a spare column before moving on to test the next column. After it has tested and replaced defective columns, the BISR system then individually tests each memory cell on a row-by-row basis, replacing any row having a defective cell with a spare row. Since it tests and repairs on a column-by-column and row-by-row basis, the BISR system doesn't have to store a large amount of result data, but the system will not optimize spare row and column allocation for, example, when a column has two or more defective cells that are not due to a global column fault.

What is needed is a BIRA subsystem for a BISR system for substantially optimizing spare row and column replacement allocation based on system test results without having to concurrently store large amounts of test results data upon which to base its allocation decisions and which does not limit test flexibility or significantly increase test time.

SUMMARY OF THE INVENTION

A built-in self-repair (BISR) system for testing and reconfiguring an array of rows and columns memory cells embedded in an integrated circuit includes a built-in replacement analysis (BIRA) subsystem for allocating spare rows and columns of memory cells for replacing array rows and columns containing defective memory cells. The BIRA subsystem allocates spare rows and columns of cells for replacing rows and columns of an array of memory cells in response to an input sequence of cell addresses generated by a built-in self-test (BIST) subsystem, a portion of the BISR system. The BIST subsystem tests the memory array and generates a cell address for each defective cell in the array, the cell address including the row address and a column address of the defective cell.

In accordance with one aspect of the invention the BIRA subsystem stores all information needed to allocate spare rows and columns in a set of row and column registers. Each row register corresponds available spare row, and each column register corresponds to an available column. The BIRA subsystem responds to incoming cell addresses by writing each included row address into a row register, by writing each included column address into a column register, and by writing link bits into the column registers. Each link bit links the row and column registers storing row and column addresses of a defective cell. The row and column addresses stored in these registers indicate the array rows and columns for which spare rows and columns are to be allocated.

In accordance with another aspect of the invention, the BIRA subsystem also writes a "multiple cell" bit into each row register to indicate when the row address it stores includes more than one defective cell.

In accordance with a further aspect of the invention, the BIRA subsystem also writes a "permanent" bit into a row or column register to indicate when the spare row or column allocation indicated by its stored row or column address is permanent.

In accordance with yet another aspect of the invention, the BIRA subsystem includes a controller for efficiently allocating spare row and columns by manipulating the data stored in the row and column registers in response to a sequence of defective cell addresses.

It is accordingly an object of the invention to provide a BIRA subsystem that can substantially optimize spare row and column allocation for an ASIC memory based on BIST subsystem test results without having to concurrently store large amounts of test results data upon which to base its allocation decisions.

BRIEF DESCRIPTION OF THE DRAWING(S)

FIG. 2 is a table mapping defective cells in the RAM of FIG. 1;

FIGS. 3–7 are graphs mapping defective cells of the RAM of FIG. 1 as it tests a RAM having defective cells as mapped in FIG. 2;

FIGS. 8–31 are tables representing the contents of registers used for data storage by the BIRA subsystem of FIG. 1 as it tests the RAM;

FIG. 32 is another table mapping defective cells in the RAM of FIG. 1;

FIGS. 33–36 are tables representing the contents of registers used for data storage by the BIRA subsystem of FIG. 1 as it tests a RAM having defective cells as mapped in FIG. 32;

FIG. 40 is a state model illustrating operation of the state machine of the BIRA subsystems of FIG. 37 and FIG. 39.

DESCRIPTION OF THE PREFERRED EMBODIMENT(S)

BISR System Architecture

Figure 1:
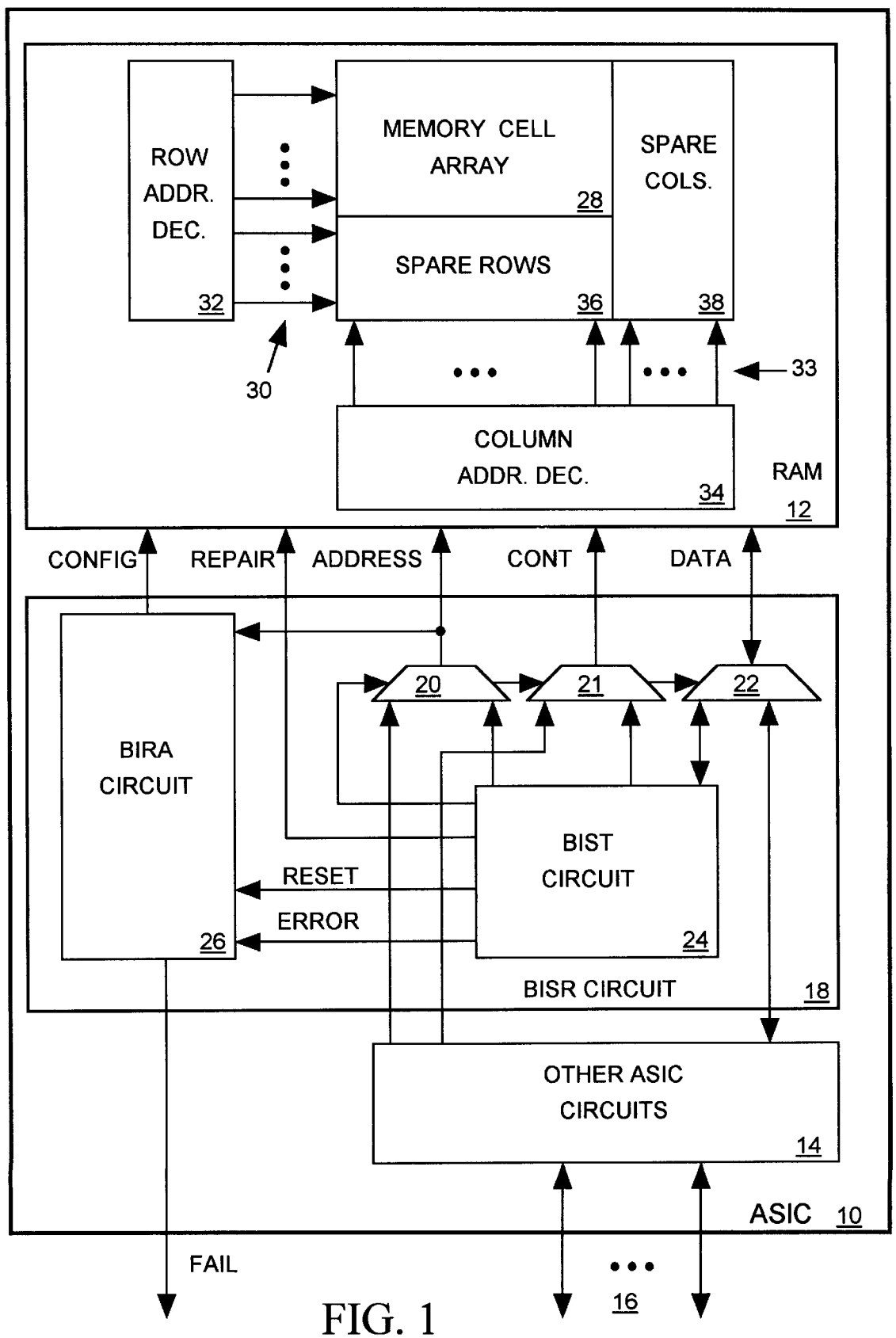
FIG. 1 illustrates in block diagram form an application specific integrated circuit (ASIC) including an embedded random access memory (RAM) and a built-in self repair (BISR) system for testing and repairing the RAM.

FIG. 1 illustrates in block diagram form an application specific integrated circuit (ASIC) 10 including an embedded random access memory (RAM) 12, and other ASIC circuits 14. During normal ASIC operation, ASIC circuits 14 also read and write access RAM 12 and communicate with external devices via the ASIC's input/output (I/O) terminals 16. Since the data, address and control terminals 32 of RAM 12 are not directly accessible to external test equipment via the ASIC's I/O terminals 16, a built-in self-repair (BISR) system 18 in accordance with the invention is incorporated into ASIC 10 to test and repair RAM 12.

ASIC circuits 14 normally read and write access the address, control and data terminals of RAM 12 via a set of multiplexers 20–22 included in BISR subsystem 18. However when BISR system 18 is to test RAM 12, (for example on system power up) a built-in self-test (BIST) subsystem 24 of BISR subsystem 18 switches multiplexers 20–22 to connect BIST subsystem 24, rather than ASIC circuits 14, to RAM 12. During the test, BIST subsystem 24 writes data into each address of RAM 12, reads the data back out that address, and compares the data written into the address to the data read back out to determine whether they match. When the RAM's input and output data do not match, BIST subsystem 24 transmits an ERROR signal to tell a built-in repair analysis (BIRA) subsystem 26 that the current memory address is defective. BIRA subsystem 26 then acquires and processes the current RAM 12 input address to produce configuration data CONFIG that tells RAM 12 how to reconfigure itself to repair the defective cell. After testing all addresses of RAM 12 and signaling BIRA subsystem 26 to acquire all defective addresses, BIST subsystem 24 transmits a REPAIR signal to RAM 12 telling it to repair itself in accordance with the CONFIG data from BIRA subsystem 26.

RAM 12 includes an array 28 of rows and columns of memory cells, each corresponding to a separate memory address and storing one or more bits of data, depending on the memory's word length. A separate row enable line 30 links each row of memory cells within array 28 to a row address decoder 32 while a separate column enable line 33 links each column of memory cells to a column address decoder 34. The address (ADDRESS) input to RAM 12 identifies the row and column of a particular cell to be read or write accessed. Row address decoder 32 decodes a row address portion of the ADDRESS to assert a row address line 30 of the array 28 row including the addressed cell. Similarly, column address decoder 34 decodes a column address portion of ADDRESS to assert the column address line 33 of the addressed cell's column. The asserted row and column address line tells an address cell to store or read out RAM data, depending on whether control signal inputs (CONT) to RAM 12 from BIST subsystem 24 or ASIC circuits 14 via multiplexer 21 specify a write or read access.

RAM 12 is equipped with one or more spare rows 36 and one or more spare columns 38. When BIST subsystem 24 transmits the REPAIR signal to RAM 12 indicating that the test is complete, RAM 12 reconfigures itself in accordance with CONFIG data from BIRA subsystem 26 to "replace" rows and columns containing defective cells with spare rows 36 and spare columns 38. The CONF data alters the way row and column address decoders 32 and 34 decode the incoming ADDRESS so that they assert the row or column address line 30 or 33 of a spare row or column when they otherwise would have asserted the row or column address line 30 or 33 of a defective row or column. Thereafter, during normal ASIC 10 operation, decoders 32 and 34 ensure that ASIC circuits 14 read or write access a cell of a spare row 36 or column 38 whenever they would otherwise have accessed a cell of the row or column of the defective cell.

The present invention relates in particular to BIRA subsystem 26 which assigns spare rows 36 and spare columns 38 for replacing defective array 28 rows and columns. As discussed below, BIRA subsystem 26 processes the ADDRESS data pointing to all defective cells in a way that enables it to efficiently allocate spare rows 36 and columns 38 when replacing defective memory cells without storing a large amount of data and without employing a large, complicated data processing circuit.

Error Data Processing

Although embedded memories typically have a large number of rows and columns, for simplicity in explaining the data processing operations of BIRA subsystem 26 we assume in the discussion to follow that memory cell array 28 of FIG. 1 has only eight rows and four columns of memory cells and we will assume that RAM 12 includes three spare rows 36 and two spare columns 38. However those skilled in the art will understand that the principles discussed will apply to cell arrays of any size and any number of spare rows and columns.

FIG. 2 illustrates a table 60 mapping the defective cells in an 8×4 memory array in a "worst case" example in which 14 cells of the array are defective. Table 60 lists memory column number Y1–14 Y4 horizontally and lists a memory row number X1–X8 vertically. A table entry at the intersection of each row X and column Y contains a logical "1" when the cell at the corresponding memory array row and column is defective and a logical "0" when the cell is not defective. We can see by inspection of table 60 that if we have three spare rows and two spare columns, we can repair RAM 12 by replacing rows X2, X3 and X8 with the three spare rows and by replacing columns Y2 and Y3 with the two spare columns.

In prior art spare row/column replacement systems, the addresses of defective cells are sent to reconfiguration analysis equipment external to the IC. Such systems for example may process the sequence of addresses of failed memory cells to develop a bit map similar to table 60 of FIG. 2. At the end of the test, such a system evaluates the bit map to find an appropriate way to allocate spare rows and columns so as to make sure that it replaces each defective memory cell. Such a bit map-based reconfiguration analysis system becomes problematic when we try to implement it as a BIRA subsystem embedded within IC 10 itself because it would require a relatively large embedded memory array just to store the bit map that would itself be a substantial source of ASIC defects. As explained below, BIRA subsystem 26 organizes and processes error information in a different way that allows if to avoid requiring large amounts of memory or complicated data processing circuitry. Before discussing how BIRA subsystem 26 operates, it is helpful to first discuss another way to organize the information represented by table 60 of FIG. 2.

FIG. 3 is a graph illustrating the same error information presented by table 60 of FIG. 2. Each row address X1–X8 is represented in FIG. 3 by a corresponding row "vertex" R1–R8 and each column address Y1–Y4 is represented by a corresponding column "vertex" C1–C4 of the graph. A set of "links" 64 link various R and C vertices to indicate defective memory cells. For example a defective cell at address (X1, Y2) is represented by a link 64 extending from vertex R1 to C2. To store error information in the manner indicated by FIG. 3, BIRA subsystem 26 could employ a separate register associated with each vertex R1–R8 and C1–C4 containing references to all vertices to which the associated vertex is connected via a link 64. Thus for example, the contents of an internal BIRA register associated with vertex R3 would point to vertices C2 and C4. Or, as another example, the contents of a registers associated with vertex C4 would point to vertices R2, R3 and R8. However such a system employing bidirectional links would include redundant information. For example, when we provide data in a register associated with vertex C2 pointing to vertices R1–R4, we don't need to store data in registers associated with vertices R1–R4 pointing back to vertex C2 because the information is redundant. Conversely, when the register associated with vertex R8 points to vertices C4 and C3, we do not need to store links back to vertex R8. Thus we can eliminate some of the data storage requirements by making links unidirectional.

FIG. 4 is a modified version of the graph of FIG. 3 in which links of the graph of FIG. 3 are made unidirectional. Note that since registers associated with vertices R1, R4–R7, C1 and C4 of FIG. 4 don't point anywhere, BIRA subsystem 26 doesn't have to have registers for storing links associated with those vertices. FIG. 5 is a modified version of the graph of FIG. 4 in which the vertices that don't point anywhere have been eliminated. Thus we see that instead of having to provide registers for eight row and four column vertices, BIRA subsystem 26 needs only to provide registers for three row and two column vertices. This matches the number of available spare rows and columns as well as the number of rows and columns that must be replaced in the "worst case" example defective cell pattern of FIG. 2. Therefore BIRA subsystem 26 needs only to include one internal data register for each spare column and one data register for each spare row. As the test of memory cell array 28 of FIG. 1 proceeds, BIRA subsystem 26 assigns each register to a row or column containing one or more defective cells by writing the row or column address into a row or column assignment field in the register.

FIG. 6 illustrates a set of registers that could implement the map of FIG. 5. Each of a set of three "row" registers RA–RC (one corresponding to each of the three spare rows) includes fields for storing the particular row address (X1–X8) of a row to which the corresponding spare row may be assigned. Each of a set of two "column" registers CA and CB (one corresponding to each of the two spare columns) includes fields for storing the particular column address (Y1–Y4) of a column to which the corresponding spare column may be assigned. Each register RA–RC, CA and CB also includes fields for storing links pointing to other registers corresponding to the links between vertices of FIG. 5. Note, however, that in FIG. 6, some links point to vertices (C1, C4, R1, and R4–R7) for which there is no corresponding register. FIG. 7 is a graph formed by removing all links from the row registers RA–RC and by removing any links from the column registers CA–CB that point a row vertex for which there is no corresponding register.

The registers RA–RC, CA and CB within BIRA subsystem 26 store the information illustrated in the graph of FIG. 7, along with some other information as discussed below. Note that because we removed some links from the graph of FIG. 6 when creating the graph of FIG. 7, the graph of FIG. 7 does not include some of the error information included in graphs of FIGS. 3–6 or in the bit map of FIG. 2. Thus at the end of the test BIRA subsystem 26 will not store all of the information needed to determine which particular cells of memory array 28 are defective. However the purpose of BIRA subsystem 26 is not necessarily to store information indicating which particular memory cells have failed but to store information indicating which particular rows and columns need to be replaced with spare rows and columns. A register system implementing the graph of FIG. 7 would correctly indicate that rows X2, X3 and X8 and columns Y2 and Y3 must be replaced with spare rows and columns. BIRA subsystem 26 appropriately loads data into registers RA–RC, CA and CB as it processes incoming addresses of defective memory cells in a way that allows it to implement the graph of FIG. 7. The CONFIG data supplied to RAM 12 at the end of the test is based on the row and column address X2, X3, X8, Y2 and Y3 appearing in registers RA–RC, CA and CB at the end of the test. Although during the course of a test BIRA subsystem 25 may discard some of the information regarding defective cell addresses, as explained below, the loss of such information does not greatly affect the efficiency with which it allocates spare rows and columns when repairing RAM 12.

FIGS. 8 and 9 are tables illustrating contents of a pair of "X" and "Y" register files BIRA subsystem 26 uses to store information during the test implementing the graph of FIG. 7. The X register file of FIG. 8 includes the three row registers RA–RC while the Y register file of FIG. 9 includes the two column registers CA and CB. Each row register RA–RC in the X register file includes a field XADDR for storing the row address of a defective row and each column register CA and CB includes a field YADDR for storing a column address of a defective column. Each column register CA, CB also includes a set of three "link" bits LA–LC (each corresponding to a separate row register RA–RC) for implementing the links of FIG. 7. Each link bit LA–LC can be set to a logical "1" to act as a link to the corresponding one of registers RA–RB.

During the course of a test, as BIRA subsystem 26 processes incoming error data, it may "assign" any register RA–RC, CA or CB to a row or column register by writing a row or column address into its XADDR or YADDR field. At the end of the test, the row and column addresses stored in these registers indicate the rows and columns to be replaced by the available spare rows and columns. During the course of a test BIRA subsystem 26 initially treats each row or column register assignment as temporary and may change a row or column assignment to improve spare row or column allocation efficiency as it continues to receive and process addresses of defective cells. In addition to the XADDR, YADDR and LA–LC data needed to implement the graph of FIG. 2, row and column registers RA–RC, CA and CB also include some additional bits (XP,XM and YP) to help BIRA subsystem 26 determine how to assign or reassign various registers to row and columns. BIRA subsystem 26 sets a "permanent row" bit XP stored in each row register RA–RC or a "permanent column" bit YP stored in column register CA, CB to a "1" to indicate the register's current row or column assignment is to be permanent and is not to be thereafter changed. BIRA subsystem 26 sets a "multiple cell" bit XM in each X register file RA–RC to indicate whether more than one cell of its assigned row is defective.

Thus to store information it needs to efficiently allocate spare row and columns, BIRA subsystem 26 needs only one X register for each spare row and one Y register for each spare column, and each register need store only a relatively few bits, as may be seen in FIGS. 8 and 9. The following discussion illustrates the process by which BIRA subsystem 26 writes data into the X and Y register files as it receives incoming ADDRESS data in response to a sequence of addresses of failed memory cells. The discussion assumes memory cell array 28 of FIG. 1 has the "worst case" failed cell pattern indicated by the table of FIG. 2.

FIGS. 10 and 11 illustrate the contents of the X and Y register files prior to the start of a memory test. On system power up, in response to the RESET signal from BIST subsystem 24, BIRA subsystem 26 initializes the XADDR and YADDR data fields stored in the X and Y register files to a NULL value that does not point to any row or column, and initializes every other bit in those registers to a logical "0". BIST subsystem 24 of FIG. 1 then tests memory cell array 28 on a row-by-row basis in order of increasing row addresses X1–X8, testing cells within each row in order of increasing column address Y1–Y4 before moving on to the next row. Thus BIST subsystem 24 will first test cell (X1,Y1) and as we can see by inspection of the failure pattern illustrated FIG. 2, BIST subsystem 24 will find that cell to be operating properly. Since the next tested cell (X1,Y2) is defective, BIST subsystem 24 will transmit an ERROR signal to BIRA subsystem 26.

FIGS. 12 and 13 illustrate how BIRA subsystem 26 alters the contents of the X and Y register files in response to the current ADDRESS value (X1,Y2) output of BIST subsystem 24 when it receives the first ERROR signal pulse. BIST subsystem 26 assigns register RA to the X1 row by writing the address of row X1 into the XADDR field of register RA, assigns register CA to the Y2 column by writing the Y2 column address into its YADDR field, and sets link bit LA in register CA to 1 to indicate that the cell at the row and column addresses referenced by the contents of CA and RA has failed. BIST subsystem 24 thereafter tests the remaining cells (X1,Y3) and (X1,Y4) of row X1. Since it does not find either of those cells to be defective it does not send ERROR signal pulses to BIRA subsystem 26 and BIRA subsystem 26 takes no action. After testing row X1, BIST subsystem 24 moves on to row X2, finds that the first cell (X2,Y1) of that row is defective, and therefore again pulses the ERROR signal input to BIRA subsystem 26.

FIGS. 14 and 15 illustrate how BIRA subsystem 26 sets the contents of the X and Y register files in response to the current ADDRESS value (X2,Y1) output of BIST subsystem 24 when it receives the ERROR signal pulse. Since registers RA and CA are already in use, BIST subsystem 26 assigns register RB to row X2 by writing address X2 into the XADDR field of register RB, assigns register CB to the Y1 column by writing the Y1 address into its YADDR field, and sets link bit LB in register CB to 1 to indicate that the cell at the row and column addresses referenced by the contents of CB and RB has failed.

FIGS. 16 and 17 illustrate how BIRA subsystem 26 sets the contents of the X and Y register files in response to the incoming ADDRESS value (X2,Y2) of the next detected defective cell. Since registers RB and CA are already assigned to the row and column of that cell, BIST subsystem 26 simply sets the XM bit of RB to a "1" to indicate there is more than one defective cell in row X2 and sets the LB bit of register CA to a "1" to indicate the cell referenced by registers RB and CA is defective.

FIGS. 18 and 19 illustrate how BIRA subsystem 26 sets the contents of the X and Y register files in response to the incoming ADDRESS (X2,Y3) of the next detected defective cell. Since both Y registers CA and CB have already been assigned to rows Y2 and Y1, BIRA subsystem 26 can't assign another Y register to Y3. However since the defective cell (X2,Y3) is in row X2 which has already been assigned to register RB, then if BIRA subsystem 26 makes make sure that row X2 is replaced, it does not need to replace column Y3 and therefore does not need to assign a column register to column Y3. Accordingly BIRA subsystem 26 sets the XP bit in register RB to "1" to indicate the register is to be permanently assigned to row X2. The XP bit reminds BIRA subsystem that it cannot thereafter reassign register RB to another row. Thus at the end of the test, RAM 12 will be sure to replace row X2 with a spare row. Up until this point column register CB had been assigned to column Y1 and indicated that only cell (X2,Y1) of that is defective,. Since BIRA subsystem 26 has by now determined that row X2 is to be replaced, it is not necessary to replace column Y1 with a spare column in order to replace the cell at address (X2,Y1). The information stored in column register CB is therefore no longer needed and BIRA subsystem 26 resets the YADDR field in register CB to NULL and resets the LB bit to a "0". This allows column register CB to be later reassigned to another column. The next detected failed cell is at address (X2,Y4), but BIRA subsystem 26 makes no change to the register contents because it has already decided to replace row X2 with a spare row.

FIGS. 20 and 21 illustrate how BIRA subsystem 26 sets the contents of the X and Y register files in response to the incoming ADDRESS value (X3,Y2) of the next detected defective cell. BIRA subsystem 26 assigns row register RC to row X3 and sets link bit LC bit in column register CA to indicate the cell referenced by registers RB and CA is defective.

FIGS. 22 and 23 illustrate how BIRA subsystem 26 sets the contents of the X and Y register files in response to the incoming ADDRESS value (X3,Y4) of the next detected defective cell. BIRA subsystem 26 assigns register CB to column Y4, sets the LC bit to a "1" to indicate the cell referenced by registers RC and CB is defective, and sets the XM bit of register RC to a "1" to indicate that row X3 has more than one defective cell.

FIGS. 24 and 25 illustrate how BIRA subsystem 26 sets the contents of the X and Y register files in response to the ADDRESS value (X4,Y2) of the next detected defective cell. Since all row registers RA–RC have been assigned, BIRA subsystem 26 makes the assignment of register CA permanent by setting its YP bit to a "1". BIRA subsystem 26 also resets each of link bits LA–LC of register CA to a logical "0". Since the guaranteed replacement of column Y2 means that the only detected failed cell (X1,Y2) in row X1 will be replaced, BIRA subsystem 26 resets register RA so that it may be reassigned later. Also since replacement of rows X2 and X3 is assured, BIRA subsystem 26 resets register CB as shown in FIG. 25 because the failed cells thus far detected in column Y4 are in rows X2 and X3.

FIGS. 26 and 27 illustrate how BIRA subsystem 26 sets the contents of the X and Y register files in response to the ADDRESS values (X5,Y3) of the next detected defective cell. Register RA is assigned to row X5 and register CB is assigned to column Y3.

FIGS. 28 and 29 illustrate how BIRA subsystem 26 sets the contents of the X and Y register files in response to the ADDRESS value (X6,Y3) of the next defective cell. Since all row registers RA–RC have been assigned, BIRA subsystem 26 makes the assignment of register Y3 permanent by setting its bit YP to a "1" and resetting all bits LA–LC to a logical "0". Since guaranteed replacement of column Y3 means that failed cell (X5,Y3) in row X5 will be replaced, BIRA subsystem 26 again resets register RA to make it available for reassignment. Also since replacement of rows X2 and X3 is assured, BIRA subsystem 26 resets register CB as shown in FIG. 25, the failed cells thus far detected in column Y4 being either in rows X2 and X3. Since the next two detected failed cells at addresses (X7,Y3) and (X8,Y3) are in a row Y3 that is guaranteed for replacement, BIRA subsystem 26 does not record any information.

FIGS. 30 and 31 illustrate how BIRA subsystem 26 sets the contents of the X and Y register files in response to the ADDRESS value (X8,Y4) of the last found defective cell. BIRA subsystem 26 assigns register RA to row X8, and since there are no more available column registers to be assigned to column Y4, BIRA circuit 26 sets the bit XP of register RA to a "1" to make the assignment permanent.

At this point BIST subsystem 24 of FIG. 1 sends the REPAIR signal pulse to RAM 12 of FIG. 1 to signal it to replace defective rows and columns in accordance with the current CONFIG data output of BIRA subsystem 26. That CONFIG data is formed by the current XADDR and YADDR contents of the X and Y register files. RAM 12 thus configures itself to replace the rows X8, X2,and X3 assigned to register files RA–RC with spare rows and to replace the columns Y2 and Y3 assigned to registers CA and CB with spare columns.

If at any time during the test process BIRA subsystem 26 finds that its is unable to resolve a detected cell failure at an X or Y address, it sends an output "FAIL" signal pulse to BIST subsystem 24 to indicate that RAM 12 has an insufficient number of spare row or columns to correct the failure pattern. BIST subsystem 24 then terminates the test, and forwards the FAIL signal to an ASIC output terminal 40 to indicate that RAM 12 is defective.

In the example above we described how BIRA system 26 handles the example bit failure pattern illustrated in FIG. 2. A situation not covered by the example arises when all X and Y register files RA–RC and CA–CB are full and BIRA system 26 encounters an error at new row and column addresses. To illustrate how BIRA system 26 handles this situation we employ another example of a RAM failure bit map.

FIG. 32 is a failure bit map of a 5×5 RAM in which all failures (1's) occur along a main diagonal. When the RAM is tested on a row-by-row basis, the first errors BIRA system 26 encounters are at addresses (X1,Y1), (X2,Y2), and (X3, Y3). Consistent with the rules discussed above, the resultant X and Y register contents appear as illustrated in FIGS. 33 and 34. When the next error at (X4,Y4) is encountered all the X register and Y register files RA–RC and CA–CB are in use and neither the current row address X4 nor the current Y address Y4 has been previously recorded. BIRA system 26 responds to the incoming address by storing the incoming address value Y4 in the Y register file CA or CB or lowest degree (i.e. fewest bits LA–LC set) and making that assignment permanent (YP=1). We also make permanent (XP=1) any row register RA–RC linked to the column address formally stored in the column register. The resultant register values after BIRA system 26 has processed the errors at addresses (X4,Y4) and (X5,Y5) are illustrated in FIGS. 35 and 36.

BIRA Circuit Architecture

Figure 37:
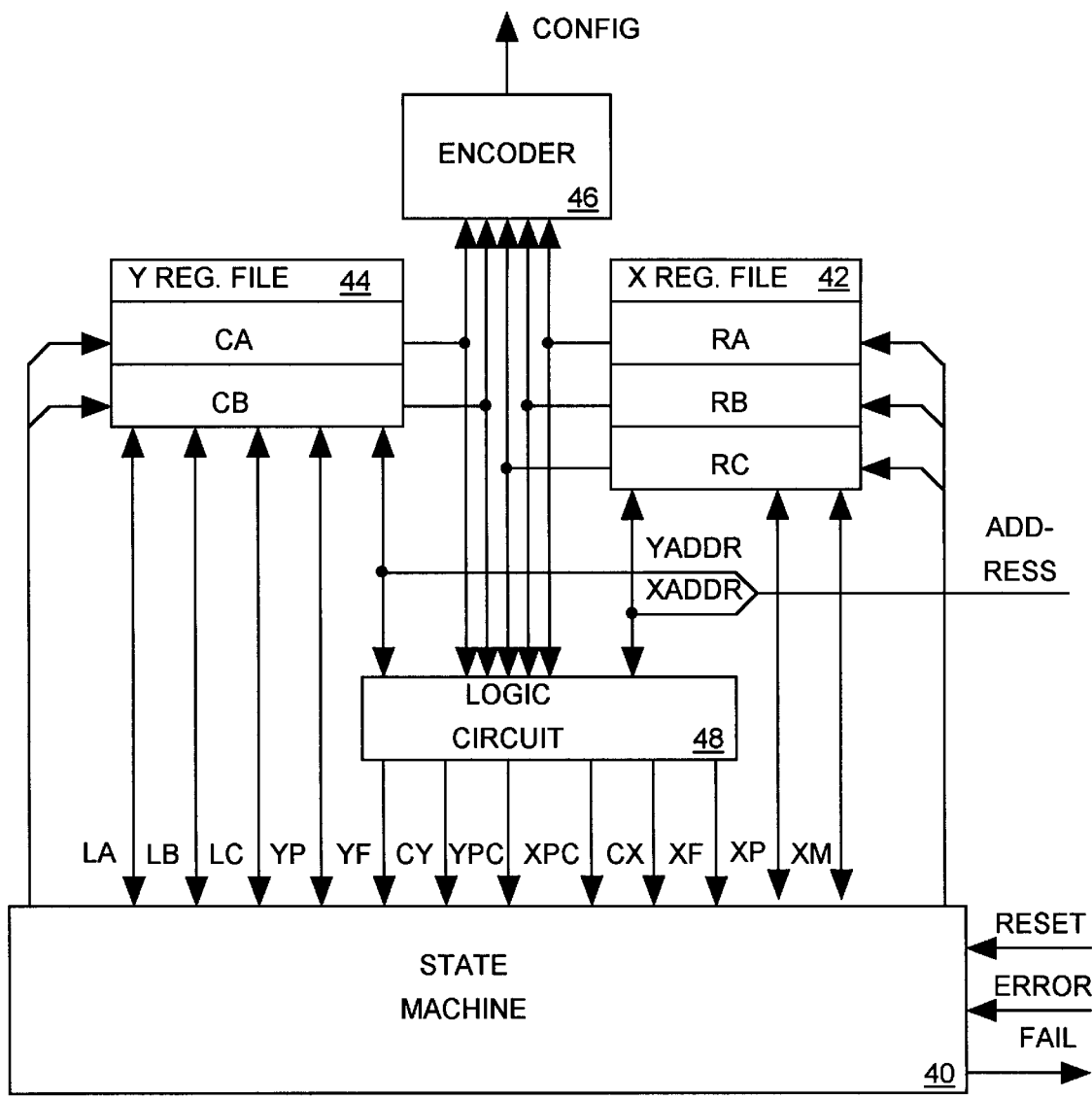
FIG. 37 illustrates the built-in repair analysis (BIRA) subsystem of the BISR system of FIG. 1 in more detailed block diagram form.

FIG. 37 illustrates BIRA subsystem 26 of FIG. 1 in more detailed block diagram form. BIRA subsystem 26 receives an ADDRESS, including the row address XADDR and column address YADDR of a defective cell, in response to each ERROR signal pulse. BIRA subsystem 26 includes a state machine 40 for controlling a Y register file 44 including the CA and CB register, and for controlling an X register file 42 including the RA–RC registers. State machine 40 can signal X register file 42 to store either a NULL value or incoming XADDR field into any of registers RA–RC and can signal Y register file 44 to store either a NULL value or an incoming YADDR field into either register CA or CB. State machine 40 also read and write accesses the XP, XM, YP, and LA–LC input bits register files 42 and 44 and produces the output FAIL signal. The RESET signal from BIST subsystem 24 of FIG. 1 initializes all values within registers CA, CB, and RA–RC as illustrated in FIG. 10 and resets state machine 40 to an initial state at the start of a test Thereafter the ERROR signal tells state machine 40 when to process an incoming address ADDRESS of a defective memory cell. When the test is complete and various registers RA–RC, CA and CB have been assigned to rows and columns to be replaced, an encoder 46 encodes the XADDR and YADDR contents of registers CA,CB, RA–RC indicating the rows and columns to be replaced to produce the appropriate input configuration data CONFIG to RAM 12 of FIG. 1.

A logic circuit 48 monitors values of the incoming XADDR and YADDR addresses and the contents of registers CA, CA, and RA–RC and provides various inputs to state machine 40 as follows:

An XF bit indicates none of registers RA–RC have a NULL XADDR field and a YF input indicates neither of registers CA nor CB has a NULL YADDR field.

A CX bit indicates that the XADDR portion of the incoming ADDRESS matches the current address contents of one of registers RA–RC.

A CY bit indicates that the YADDR portion of the incoming ADDRESS matches the current address contents of one of registers CA and CB.

An XPC bit indicates that the XADDR portion of the incoming ADDRESS matches the current address contents of one of registers RA–RC that has been permanently assigned to an XADDR value.

A YPC bit indicates that the YADDR portion of the incoming ADDRESS matches the current address contents of one of registers CA or CB that has been permanently assigned to a YADDR value.

Multiple-Bit I/O RAMs

In the above description of the invention we assumed for simplicity that RAM 12 is a single bit I/O device, storing only a single bit at each memory address. However in many applications RAM 12 will be a multiple-bit I/O device storing a word having more than one bit at each memory address. Where such RAMs include spare row and column replacement capability, spare "columns" may be only a single bit wide. When a single bit of a word at some column is defective, we can use a spare column to replace only that particular bit of every word of that particular column.

Figure 38:
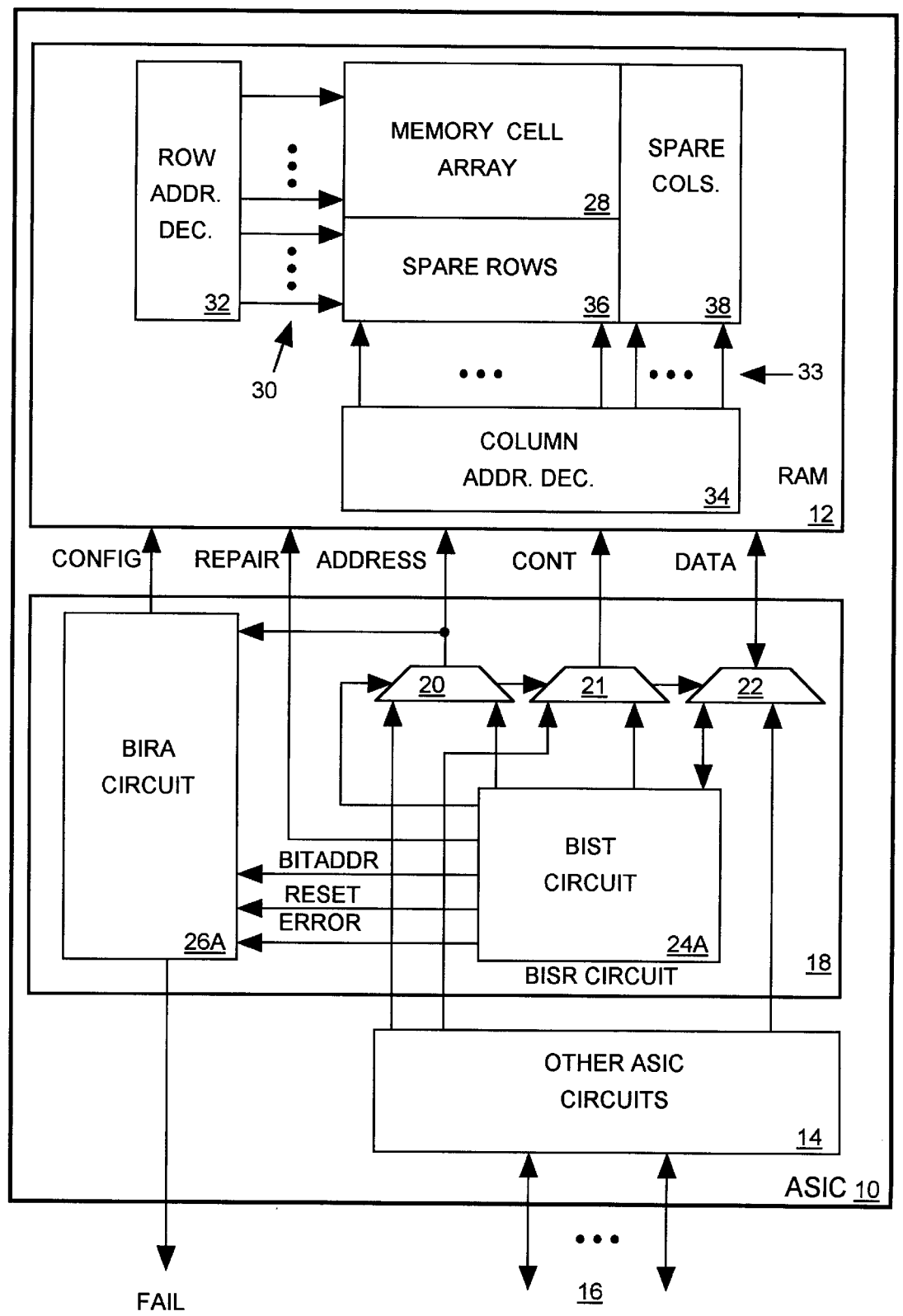
FIG. 38 illustrates in block diagram form an alternative embodiment of the ASIC of FIG. 1.

FIG. 38 depicts an alternative version of ASIC 10 of FIG. 1 wherein a BIST circuit 24A and BIRA circuit 26A are adapted to accommodate RAM 12 when it is a multiple-bit I/O device. In this version, BIST circuit 24A supplies BIRA circuit 26A with an additional input word BITADDR identifying the position (or "bit address") within that word of a particular bit that failed a memory test. When BIST circuit 24A detects a single failed bit in a word at the current RAM 12 address, it sets the BITADDR data to indicate the bit's position within the word when it pulses the ERROR signal. When BIST circuit 24A detects more than one failed bit at the current address, it pulses the ERROR signal once for each failed bit, updating BITADDR between ERROR signal pulses to indicate the position of the next failed bit.

Figure 39:
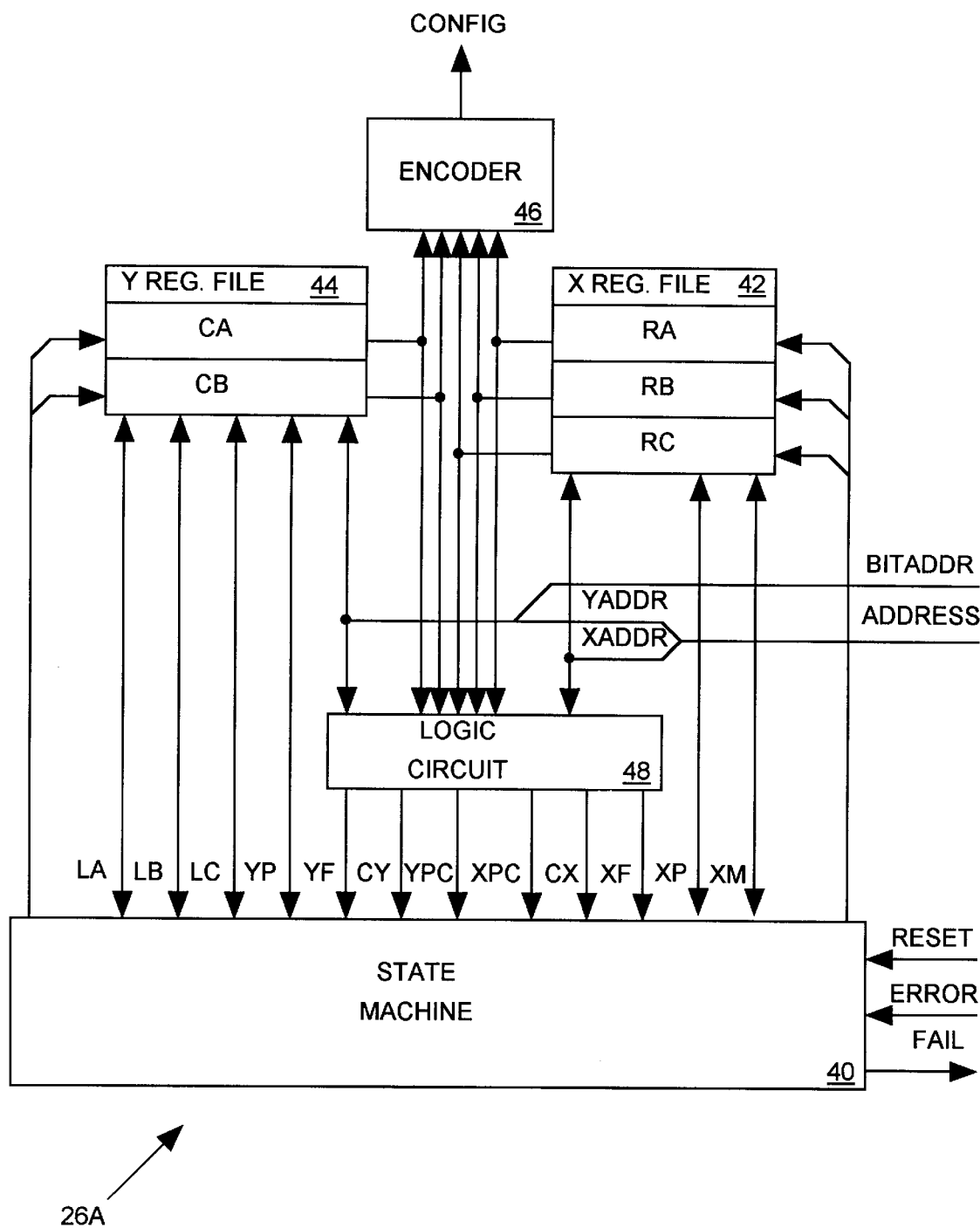
FIG. 39 illustrates the BIRA subsystem of the BISR system of FIG. 39 in more detailed block diagram form.

FIG. 39 illustrates BIRA circuit 26A of FIG. 34 in more detailed block diagram form. BIRA circuit 26A is substantially similar to BIRA circuit 26 of FIG. 32 except that the incoming BITADDR data is appended to the incoming column address YADDR so that to BIRA circuit 26, the column address appears to be YADDR,BITADDR rather than the actual column address YADDR. Thus BIRA circuit 26A treats each bit of a word stored at some memory address as having a separate column address.

Where RAM 12 of FIG. 34 is unable to provide multiple spare columns to correct simultaneous failures of multiple bits in a memory word, BIST circuit 24 may be adapted to supply an additional signal to state machine 40 of FIG. 39 indicating when more than one bit of the currently tested word has failed. State machine 40 may be configured to respond to that signal by forcing a spare row replacement.

State Machine

FIG. 40 is a state model illustrating operation of state machine 40 of FIG. 37. The left-most column of FIG. 40 indicates an "action code" referencing the action(s) the state machine 40 is to take in response to each combination of XF, YF, CX, CY, XPC, YPC input bits listed in the remaining columns of FIG. 40 when an incoming ERROR signal pulse indicates that BIST subsystem 24 of FIG. 1 has found a bad cell. Any possible state not listed in FIG. 40 causes state machine 40 to generate the FAIL signal. In FIG. 40 an "X" in any column indicates a bit state that may be either a "0" or a "1". The following defines the actions state machine 40 may take in response to each combination of its input bits XF, YF, CX, CY, XPC, and YPC as listed in FIG. 40.

| CODE | ACTION |
| --- | --- |
| NO ACTION: | Do Nothing |
| LATCHX: | Latch XADDR value in an available register RA-RC |
| LATCHY: | Latch YADDR value in an available register CA,CB |
| LATCHC: | Latch appropriate LA-LC bit in appropriate CA,CB register |
| ADDC: | Set to "1" the appropriate LA-LC bit of the appropriate CA or CB register |
| SUBC: | Set to "0" all LA-LC bits of appropriate CA or CB register |
| LATCHXP: | Latch XADDR value in an available register RA-RC and set XP to "1" |
| LATCHYP: | Latch YADDR value in an available register CA,CB and set YP to "1" |
| MAKEXP: | Set XP bit to "1" in appropriate register RA-RC |
| MAKEYP: | Set YP bit to "1" in appropriate register CA,CB |
| REMX1D: | Reset XM register having XM = "0" |
| MAKEXMD: | Set XP bit to "1" of register RA-RC having XM = "1" |
| REPNPYLD: | Reset register CA or CB having SM = 0 |
| MAKEXPIPFC: | Make appropriate register RA-RC bit XP = "1" |
| REMY0D: | Reset any register CA or CB having all "0" LA-LC bits |

Thus has been shown and described a BIRA subsystem of a BISR system 26 for allocating spare rows and columns of cells for replacing rows and columns of an array of memory cells in response to an input sequence of cell addresses, each identifying a row address (XADDR) and a column address (YADDR) of each defective cell of the cell array. The BIRA subsystem, including a row register (RA–RC) corresponding each spare row and a column register (CA,CB) corresponding to each spare column, responds to incoming cell addresses by writing their included row address into the row registers, by writing their column addresses into the column registers, and by writing link bits (LA–C) into the column registers. Each link bit links a row and a column register storing row and column addresses of a defective cell. The BIRA subsystem also writes a multiple cell bit (XM) into each row register to indicate when the row address it stores includes more than one defective cell. The row and column addresses stored in these registers indicate the array rows and columns for which spare rows and columns are to be allocated. Each row and column register also includes a "permanent" bit (XP or YP) the BIRA subsystem sets to indicate when the spare row or column allocation indicated by its stored row or column address is permanent. The BIRA subsystem efficiently allocates spare row and columns by manipulating the addresses and data bits stored in the row and column registers as it processes the input sequence of defective cell addresses.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for generating output configuration data allocating spare rows and columns of cells for replacing I rows and J columns of an array of memory cells in response to incoming cell addresses, each including a row address and a column address of a defective cell of said array, wherein I and J are integers greater than 0, and wherein said array is implemented in an integrated circuit (IC), the apparatus comprising:

I row registers implemented in said IC, each corresponding to a separate one of the spare rows, for storing a row address of an array row including at least one defective cell;

J column registers implemented in said IC, each corresponding to a separate one of the spare columns, for storing a column address of an array column including at least one defective cell, and for storing a set of I link bits, each corresponding to a separate one of said I row registers; and control means for responding to an incoming cell address by writing its included row address into one of said row registers, by writing its included column address and a link bit into one of said column registers, said link bit corresponding to said one of said row registers.

2. The apparatus in accordance with claim 1 further comprising means implemented in said IC for generating said configuration data in response to row and column addresses stored by said row registers and column registers.

3. The apparatus in accordance with claim 1 wherein when an incoming cell address includes a column address already stored in one of said column registers, said control means responds to said column address by writing a link bit into said one of said column registers.

4. The apparatus in accordance with claim 3 wherein when an incoming cell address includes a row address already stored in one of said row addresses, and a column already stored in one of said column registers, said control means responds to said column address by writing a link bit corresponding to said one of said row registers into said one of said column registers.

5. The apparatus in accordance with claim 4 wherein each of said row registers includes means for storing a multiple cell bit, and wherein when an incoming cell address includes a row address already stored in one of said row registers, said control means writes said multiple cell bit into that row register to indicate that the array row of that address includes more than one defective cell.

6. The apparatus in accordance with claim 5 wherein when each of said row address registers already stores a row address, and wherein an incoming cell address includes a row address not already stored in one of said row registers, said control means writes a permanent column assignment bit into a column address register storing a column address identified by said incoming cell address and removes row addresses from each row address register corresponding to a link bit stored in that column address register, provided the corresponding row address register in not currently storing a multiple cell bit.

7. The apparatus in accordance with claim 6 wherein each of said column registers includes means for storing a permanent column assignment bit, wherein when said control means writes said permanent column assignment bit into a column register bit to permanently assign a spare column to replace an array column identified by the column address stored in said column register, wherein when an incoming cell address includes a column address already stored in one of said column registers also storing a permanent column bit, said control means refrains from altering contents of any of said row and column registers, wherein each of said row registers includes means for storing a permanent row assignment bit, wherein when said control means writes said permanent row assignment bit into a row register bit to permanently assign a spare row to replace an array row identified by the row address stored in said row register, and wherein when an incoming cell address includes a row address already stored in one of said column registers, and wherein said one of said row registers stores a permanent row bit, said control means refrains from altering contents of any of said row and column registers.

8. The apparatus in accordance with claim 1 wherein when an incoming cell address includes a row address already stored in one of said row addresses, and a column address already stored in one of said column registers, said control means responds to said column address by writing a link bit corresponding to said one of said row registers into said one of said column registers.

9. The apparatus in accordance with claim 1 wherein each of said row registers includes means for storing a multiple cell bit, and wherein when an incoming cell address includes a row address already stored in one of said row registers, said control means writes said multiple cell bit into that row register to indicate that row address includes more than one defective cell.

10. The apparatus in accordance with claim 9 wherein when each of said row address registers already stores a row address, and wherein an incoming cell address includes a row address not already stored in one of said row registers, said control means writes a permanent column assignment bit into a column address register storing a column address identified by said incoming cell address and removes row addresses from each row address register corresponding to a link bit stored in that column address register, provided the corresponding row address register in not currently storing a multiple cell bit.

11. The apparatus in accordance with claim 1
wherein each of said column registers includes means for storing a permanent column assignment bit, and
wherein when said control means writes said permanent column assignment bit into a column register bit to permanently assign a spare column to replace an array column identified by the column address stored in said column register.

12. The apparatus in accordance with claim 11
wherein when an incoming cell address includes a column address already stored in one of said column registers also storing a permanent column bit, said control means refrains from altering contents of any of said row and column registers.

13. The apparatus in accordance with claim 1
wherein each of said row registers includes means for storing a permanent row assignment bit, and
wherein said control means writes said permanent row assignment bit into a row register bit to permanently assign a spare row to replace an array row identified by the row address stored in said row register.

14. The apparatus in accordance with claim 13
wherein when an incoming cell address includes a row address already stored in one of said column registers, and wherein said one of said row registers stores a permanent row bit, said control means refrains from altering contents of any of said row and column registers.

15. A built-in self-repair (BISR) system for testing an array of rows and columns memory cells embedded in an integrated circuit (IC) and for reconfiguring said array to replace at least of said rows containing a defective cell with a spare row and for replacing at least one of said columns containing a defective cell with a spare column, each cell having a unique combination of row and column address, said array including I spare rows and J spare columns where I and J are integers greater than 0; the BISR system comprising:
    a built-in self-test (BIST) subsystem incorporated into said IC for testing each cell of said array to determine whether it is defective and for generating as output a cell address of each defective cell of said array, each cell address including a row address of the defective cell and a column address of the defective cell; and
    a built-in replacement analysis (BIRA) subsystem for receiving row and column addresses generated by said BIST subsystem, the BIRA subsystem comprising:
        I row registers, each corresponding to a separate one of the spare rows, for storing a row address of an array row including at least one defective cell;
        J column registers, each corresponding to a separate one of the spare columns, for storing a column address of an array column including at least one defective cell, and for storing a set of I link bits, each corresponding to a separate one of said I row registers; and
        control means for responding to an incoming cell address by writing its included row address into one of said row registers, by writing its included column address and a link bit into one of said column registers, said link bit corresponding to said one of said row registers.

16. The BISR system in accordance with claim 15
wherein when an incoming cell address includes a column address already stored in one of said column registers, said control means responds to said column address by writing a link bit into said one of said column registers; and
wherein when an incoming cell address includes a row address already stored in one of said row addresses, and a column address already stored in one of said column registers, said control means responds to said column address by writing a link bit corresponding to said one of said row registers into said one of said column registers.

17. The BISR system in accordance with claim 16
wherein each of said row registers includes means for storing a multiple cell bit; and
wherein when an incoming cell address includes a row address already stored in one of said row registers, said control means writes said multiple cell bit into that row register to indicate that row address includes more than one defective cell.

18. The BISR system in accordance with claim 17
wherein each of said row registers includes means for storing a permanent row assignment bit, indicating a spare row is permanently assigned to replace an array row identified by the row address stored in said row register;
wherein each of said column registers includes means for storing a permanent column assignment bit, indicating a spare column is permanently assigned to replace an array column identified by the column address stored in said column register;
wherein when each of said row address registers already stores a row address and an incoming cell address includes a row address not already stored in one of said row registers, said control means writes a permanent column assignment bit into a column address register storing a column address identified by said incoming cell address and removes row addresses from each row address register corresponding to a link bit stored in that column address register, provided the corresponding row address register in not currently storing a multiple cell bit; and
wherein when each of said column address registers already stores a row address and an incoming cell address includes a column address not already stored in one of said column registers, said control means writes a permanent row assignment bit into a row address register storing a row address identified by said incoming cell address.

* * * * *